(12) United States Patent
Lim et al.

(10) Patent No.: US 12,733,559 B2
(45) Date of Patent: Sep. 8, 2026

(54) ELECTRONIC DEVICES AND METHODS OF MANUFACTURING ELECTRONIC DEVICES

(71) Applicant: Amkor Technology Singapore Holding Pte. Ltd., Singapore (SG)

(72) Inventors: Gi Tae Lim, Seoul (KR); Wook Choi, Incheon (KR); Seul Bee Lee, Incheon (KR)

(73) Assignee: Amkor Technology Singapore Holding Pte. Ltd., Singapore (SG)

( * ) Notice: Subject to any disclaimer, the term of this patent is extended or adjusted under 35 U.S.C. 154(b) by 565 days.

(21) Appl. No.: 18/348,167

(22) Filed: Jul. 6, 2023

(65) Prior Publication Data

US 2025/0014975 A1 Jan. 9, 2025

(51) Int. Cl.
*H10W 90/00* (2026.01)
*H10W 70/05* (2026.01)

(52) U.S. Cl.
CPC ....... *H10W 90/701* (2026.01); *H10W 70/092* (2026.01)

(58) Field of Classification Search
CPC . H10W 72/20–29; H10W 72/851–889; H10W 90/401
See application file for complete search history.

(56) References Cited

U.S. PATENT DOCUMENTS

| | | | | |
|---|---|---|---|---|
| 8,319,338 B1 | 11/2012 | Berry et al. | | |
| 8,536,462 B1 | 9/2013 | Darveaux et al. | | |
| 9,362,140 B2 | 6/2016 | Hu | | |
| 11,089,685 B2 | 8/2021 | Yoshida et al. | | |
| 11,621,243 B2 | 4/2023 | Berry et al. | | |
| 2008/0251281 A1* | 10/2008 | Buchwalter | H01L 21/563 | 257/781 |
| 2015/0325543 A1* | 11/2015 | Katkar | B23K 1/0016 | 219/121.64 |
| 2022/0157698 A1* | 5/2022 | Manack | H01L 23/315 | |
| 2023/0387100 A1* | 11/2023 | Yang | H01L 21/4853 | |

FOREIGN PATENT DOCUMENTS

CN 102861963 A * 1/2013

* cited by examiner

*Primary Examiner* — Evan G Clinton
(74) *Attorney, Agent, or Firm* — KW Law, LLP

(57) ABSTRACT

In one example, an electronic device can comprise a first substrate, an electronic component disposed over a side of the first substrate, and a vertical interconnect coupled to the side of the first substrate. The vertical interconnect can comprise a first metallic core ball proximate the first substrate, a second metallic core ball disposed above the first metallic core ball and distal from the first substrate, and a fusible material coupling the first metallic core ball with the second metallic core ball. The fusible material can be coupled to the first substrate. A second substrate can be disposed over the electronic component and the vertical interconnect. The fusible material of the vertical interconnect can be coupled to the second substrate. Other examples and related methods are also disclosed herein.

20 Claims, 9 Drawing Sheets

200
207
104
104
206
206
208
204
202
201
207

200
207
104
104
205
106
205
106
206
208
204
202
201
207

ELECTRONIC DEVICES AND METHODS OF MANUFACTURING ELECTRONIC DEVICES

TECHNICAL FIELD

The present disclosure relates, in general, to electronic devices, and more particularly, to electronic devices and methods for manufacturing electronic devices.

BACKGROUND

Prior electronic packages and methods for forming electronic packages are inadequate, resulting in, for example, excess cost, decreased reliability, relatively low performance, or package sizes that are too large. Further limitations and disadvantages of conventional and traditional approaches will become apparent to one of skill in the art, through comparison of such approaches with the present disclosure and reference to the drawings.

Figure 1:
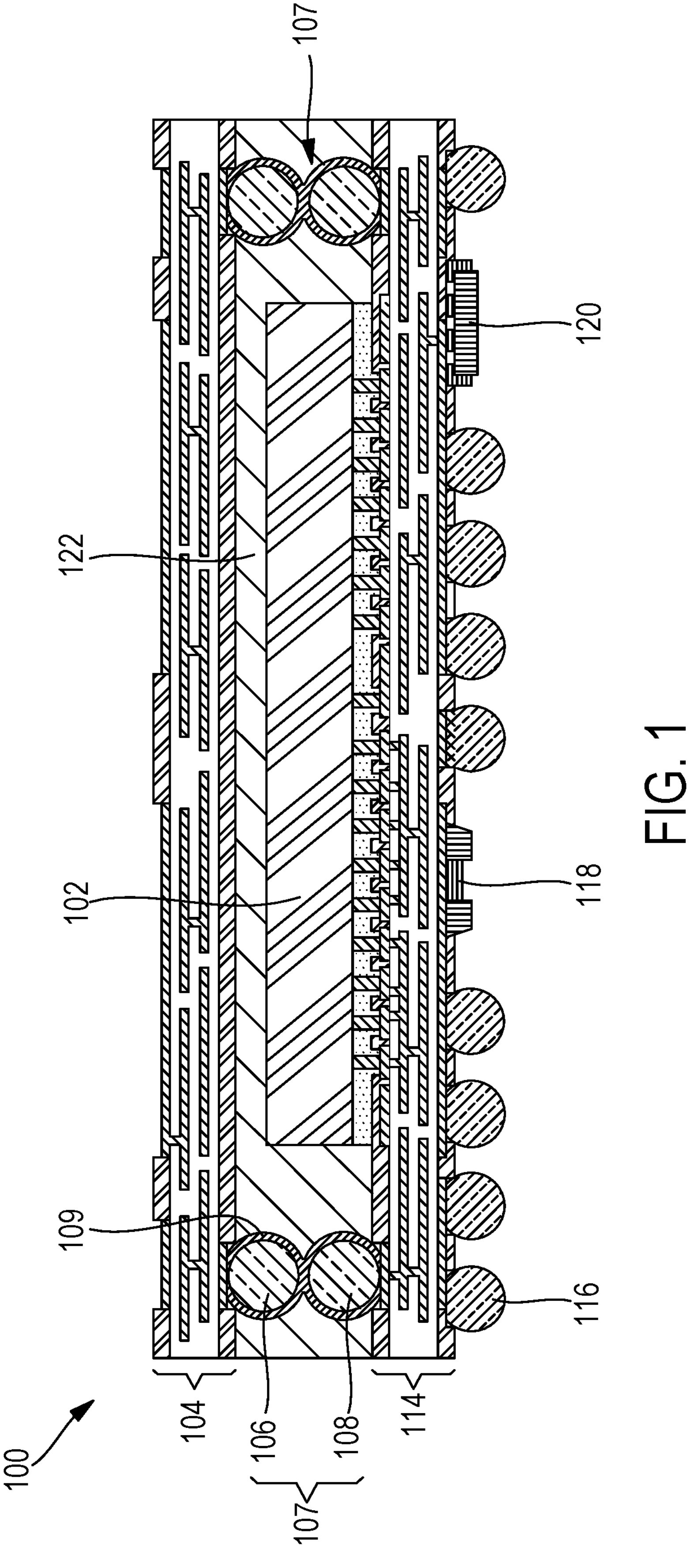
FIG. 1 illustrates a cross-sectional view of an example electronic device.

The following discussion provides various examples of electronic devices and methods of manufacturing electronic devices. Such examples are non-limiting, and the scope of the appended claims should not be limited to the particular examples disclosed. The detailed description herein is presented for purposes of illustration only and not of limitation. For example, the steps recited in any of the method or process descriptions may be executed in any order and are not necessarily limited to the order presented. In the following discussion, the terms "example" and "e.g." are non-limiting.

The figures illustrate the general manner of construction, and descriptions and details of well-known features and techniques may be omitted to avoid unnecessarily obscuring the present disclosure. In addition, elements in the drawing figures are not necessarily drawn to scale. For example, the dimensions of some of the elements in the figures may be exaggerated relative to other elements to help improve understanding of the examples discussed in the present disclosure. The same reference numerals in different figures denote the same elements.

The term "or" means any one or more of the items in the list joined by "or." As an example, "x or y" means any element of the three-element set {(x), (y), (x, y)}. As another example, "x, y, or z" means any element of the seven-element set {(x), (y), (z), (x, y), (x, z), (y, z), (x, y, z)}.

The terms "comprises," "comprising," "includes," and "including" are "open ended" terms and specify the presence of stated features, but do not preclude the presence or addition of one or more other features.

The terms "first," "second," etc. may be used herein to describe various elements, and these elements should not be limited by these terms. These terms are only used to distinguish one element from another. Thus, for example, a first element discussed in this disclosure could be termed a second element without departing from the teachings of the present disclosure.

Unless specified otherwise, the term "coupled" may be used to describe two elements directly contacting each other or to describe two elements indirectly coupled by one or more other elements. For example, if element A is coupled to element B, then element A can be directly contacting element B or indirectly coupled to element B by an intervening element C. Similarly, the terms "over" or "on" may be used to describe two elements directly contacting each other or describe two elements indirectly coupled by one or more other elements. As used herein, the term coupled can refer to an electrical coupling or a mechanical coupling.

DESCRIPTION

An example electronic device can comprise a first substrate, an electronic component disposed over a side of the first substrate, and a vertical interconnect coupled to the side of the first substrate. The vertical interconnect can comprise a first metallic core ball proximate the first substrate, a second metallic core ball disposed above the first metallic core ball and distal from the first substrate, and a fusible material coupling the first metallic core ball with the second metallic core ball. The fusible material can be coupled to the first substrate. A second substrate can be disposed over the electronic component and the vertical interconnect. The fusible material of the vertical interconnect can be coupled to the second substrate.

Another example electronic device can comprise a first inner terminal, a fusible material coupled to the first inner terminal, and a first metallic core ball proximate the first inner terminal and coupled to the fusible material. A second metallic core ball can be distal from the first inner terminal and coupled to the fusible material. A second inner terminal can be coupled to the fusible material and proximate the second metallic core ball.

An example method of making an electronic device can comprise the steps of providing a first substrate, providing a first metallic core ball on the first substrate, and providing a second substrate. A second metallic core ball can be provided on a side of the second substrate. An electronic device can be provided on the side of the second substrate. The first metallic core ball can be coupled to the second metallic core ball with a fusible material.

Other examples are included in the present disclosure. Such examples may be found in the figures, in the claims, or in the description of the present disclosure.

Various example devices and methods incorporate vertical interconnect structures having multiple metallic core balls (e.g., copper core balls) stacked vertically and coupled together by fusible material. The use of multiple metallic core balls in a single vertical interconnect structure can enable the use of a thicker die in electronic devices, which tends to improve thermal performance. Multiple stacked metallic core balls per vertical interconnect can simplify thermocompression bonding (TCB), for example, by creating a vertical interconnect with sufficient joint height before performing a pullback step to artificially stretch the vertical interconnect. The joint height and fusible volume of the vertical interconnect structures can also be controlled by selecting the diameters of the top and bottom metallic core balls used to form the vertical interconnect.

Figures 2A, 2B:
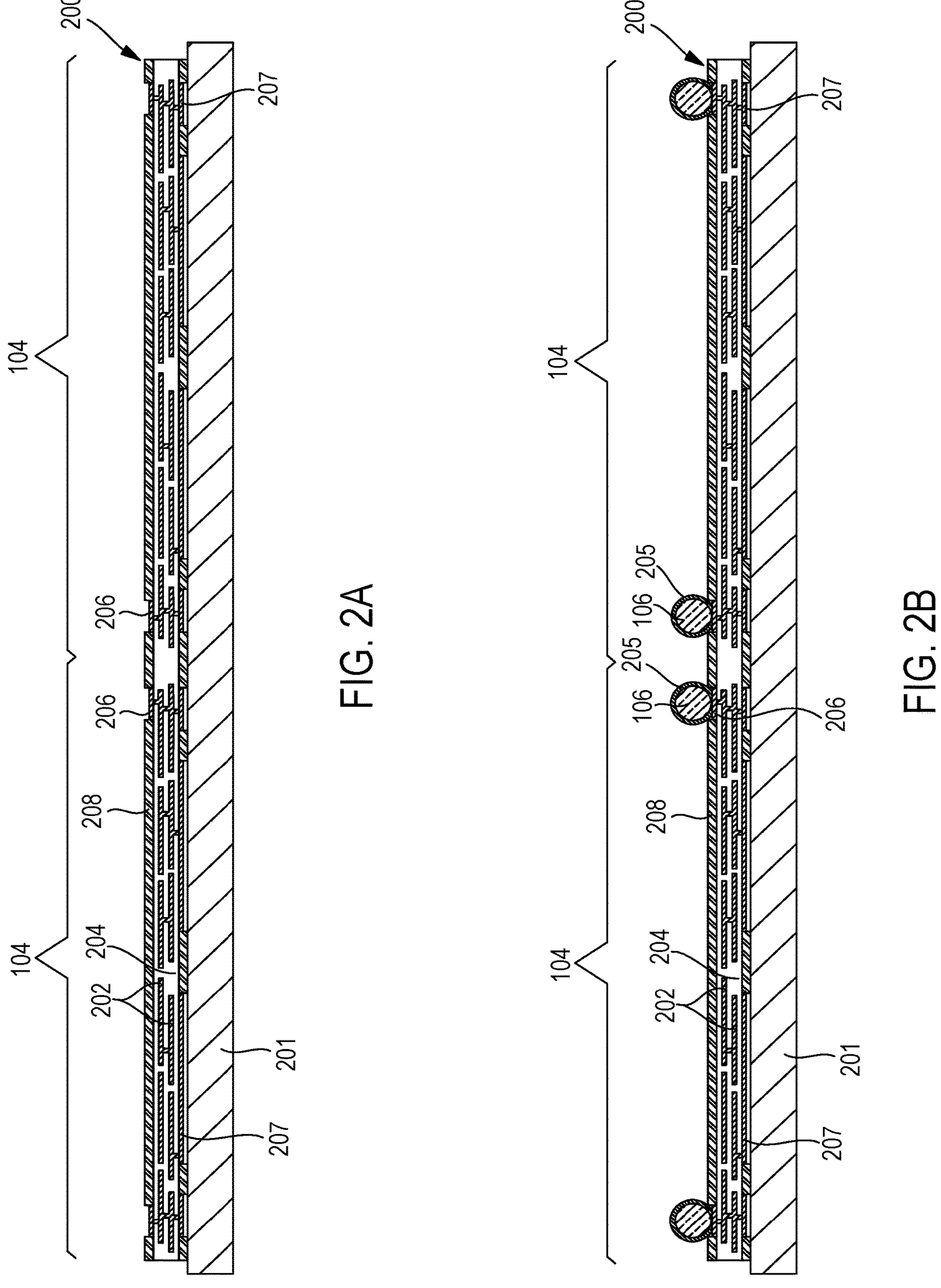
FIGS. 2A to 2I illustrate an example method for manufacturing an electronic device.

Referring now to FIG. 1, a cross-sectional view of example electronic device 100 is shown. In the example of FIG. 1, electronic device 100 can comprise electronic component 102, vertical interconnect(s) 107, redistribution structure 104, and redistribution structure 114. In some examples, electronic device 100 can further comprise external interconnects 116, electronic component 118, electronic component 120, or encapsulant 122. In accordance with various examples, electronic component 102 can be coupled to redistribution structure 114. Vertical interconnects 107 can comprise upper metallic core balls 106 and lower metallic core balls 108. Upper metallic core ball can be stacked vertically 106 on lower metallic core balls 108. Upper metallic core ball and lower metallic core balls 108 can be coupled together by fusible material 109. Vertical interconnects 107 can be coupled to redistribution structure 114 and redistribution structure 104 by fusible material 109. Upper metallic core ball 106 can be proximate redistribution structure 104 and distal from redistribution structure 114. Lower metallic core ball 108 can be proximate redistribution structure 114 and distal from redistribution structure 104. Encapsulant 122 can be disposed between redistribution structure 104 and redistribution structure 114, on electronic component 102, and on vertical interconnects 107. External interconnects 116, electronic component 118, or electronic component 120, or other passive devices, electronic components, or interconnects can be coupled to redistribution structure 114 on an external side of electronic device 100 (e.g., on a side of redistribution structure 114 opposite electronic component 102 and encapsulant 122). In some examples, electronic component 118 can comprise a land side capacitor 118 (LSC). In some examples, electronic component 120 can comprise a deep trench capacitor 120 (DTC), FIGS. 2A to 2I show an example method for manufacturing electronic device 100 using cross-sectional views. FIG. 2A shows electronic device 100 at an early stage of manufacture. In the example shown in FIG. 2A, substrate 200 can be provided on the surface of carrier 201. In some examples, substrate 200 can comprise multiple redistribution structures 104 formed integrally with one another and arranged in rows, columns, an array, or any other arrangement. Redistribution structure 104 can be used as an upper redistribution structure in subsequent steps described below. Substrate 200 can comprise dielectric structure 204 and conductive structure 202. Conductive structure 202 can comprise inner terminals 206 and outer terminals 207. An inner dielectric layer 208 of dielectric structure 204 can be adjacent and partially covering inner terminals 206 of conductive structure 202 on an inner side of substrate 200. Outer terminals 207 of conductive structure 202 can be provided on an outer side of substrate 200 opposite inner terminals 206 (e.g., on a side of substrate 200 that is facing carrier 201).

In some examples, outer terminals 207 or inner terminals 206 can comprise patterns on the surface of carrier 201. Outer terminals 207 or inner terminals 206 can comprise or be referred to as conductors, conductive materials, pads, lands, or under-bump-metallurgies (UBMs). In some examples, outer terminals 207 or inner terminals 206 can comprise copper, gold, silver, or nickel. In some examples, outer terminals 207 or inner terminals 206 can be provided through plating. For example, outer terminals 207 or inner terminals 206 can be provided through plating using a seed layer. After the metal seed layer is provided over the upper surface of carrier 201, a mask pattern is provided over the upper surface of the seed layer. For example, the mask pattern can comprise a photoresist material. Outer terminals 207 or inner terminals 206 are then plated on portions of the seed layer that are exposed from the mask pattern. The mask pattern and the portions of the seed layer located under the mask pattern can be removed after outer terminals 207 or inner terminals 206 are formed. In some examples, the thicknesses of outer terminals 207 or inner terminals can range from approximately 3 micrometers (μm) to 20 μm. As used herein with reference to measurements of length, approximately can mean+/−5%, +/−10%, +/−15%, +/−20%, or +/−25%.

In some examples, carrier 201 can be a substantially planar plate. Carrier 201 can comprise or be referred to as a plate, a board, a wafer, a panel, or a strip. For example, carrier 201 can be made of steel, stainless steel, aluminum, copper, ceramic, glass, or a wafer comprising semiconductor material. In some examples, the thickness of carrier 201 can range from approximately 300 μm to 2000 μm, and the width of carrier 201 can range from approximately 100 millimeters (mm) to 300 mm. Carrier 201 serves to support and enable handling of components during a process of providing substrate 200.

In some examples, carrier 201 can comprise a temporary bond layer provided on the surface of carrier 201. Outer terminals 207 can be provided on the surface of the temporary bond layer of carrier 201. The temporary bond layer can be formed by performing, on the surface of carrier 201, a coating process such as spin coating, doctor blade coating, casting, painting, spray coating, slot die coating, curtain coating, slide coating, or knife over edge coating, a printing process such as screen printing, pad printing, gravure printing, flexography printing, or offset printing, an inkjet printing process, an intermediate technology between coating and printing, or by direct attachment of an adhesive film or an adhesive tape. In some examples, the temporary bond layer can comprise or be referred to as a temporary adhesive film, a temporary adhesive tape, or a temporary adhesive coating. For example, the temporary bond layer can be a heat release tape (film) or an optical release tape (film) and the adhesive strength can be weakened or removed by heat or light, respectively. In some examples, the temporary bond layer can have the adhesive strength weakened or removed by physical or chemical external force. The temporary bond layer can allow carrier 201 to be separated from substrate 200.

In some examples, dielectric structure 204 can be provided on the upper sides of outer terminals 207 and carrier 201. After dielectric structure 204 is provided to cover the outer terminals 207 and the carrier 201, openings exposing outer terminals 207 can be provided in dielectric structure 204. For example, the openings can be formed by forming a mask pattern on the upper side of the dielectric structure 204 and then removing the exposed dielectric structure 204 through etching. In some examples, the openings can be referred to as or comprise apertures or holes. In some examples, dielectric structure 204 can comprise or be referred to as a dielectric layer, a coreless layer, or a filler-free layer. For example, dielectric structure 204 can comprise an electrical insulating material such as polyimide (PI), benzocyclobutene (BCB), polybenzoxazole (PBO), resin or Ajinomoto buildup film (ABF). In some examples, dielectric structure 204 can be formed by spin coating, spray coating, dip coating, or rod coating. In some examples, the thickness of individual layers of dielectric structure 204 can range from approximately 5 μm to 30 μm.

In some examples, conductive structure 202 can be provided over and interleaved with layers of dielectric structure 204. Conductive structure 202 can include one or more conductive layers and form conductive paths horizontally and vertically through dielectric structure 204. Conductive structure 202 can be provided to have multiple patterns, and the respective patterns can be electrically connected to outer terminals 207 and inner terminal 206 of conductive structure 202. In some examples, conductive structure 202 can comprise or be referred to as conductive layers, traces, pads, vias, redistribution layers (RDLs), wiring patterns, or circuit patterns. In some examples, conductive structure 202 can comprise copper, gold, silver, or nickel. In some examples, conductive structure 202 can include elements, features, materials, or manufacturing methods similar to or the same as those previously described for outer terminals 207. Outer terminals 207 can be part of conductive structure 202. In some examples, the overall thickness of individual layers of conductive structure 202 can range from approximately 3 μm to 20 μm. Conductive structure 202 can include inner terminals 206 positioned at the inner (e.g., upper in FIG. 2A) side of dielectric structure 204.

In some examples, inner dielectric layer 208 of dielectric structure 204 can be provided on the upper sides of inner terminals 206. After inner dielectric layer 208 is provided to cover the inner terminals 206, openings exposing inner terminals 206 can be provided in inner dielectric layer 208. For example, the openings can be formed by forming a mask pattern on the upper side of the inner dielectric layer 208 and then removing the exposed portions of inner dielectric layer 208 through etching. In some examples, the openings can be referred to as or comprise apertures or holes. Inner dielectric layer 208 can be formed by spin coating, spray coating, dip coating, or rod coating. In some examples, the thickness of inner dielectric layer 208 can range from approximately 5 μm to 30 μm. In some examples, inner dielectric layer 208 can comprise a solder resist.

It is contemplated and understood that one or more layers or elements of conductive structure 202 can be interleaved with dielectric structure 204 and that dielectric structure 204 and conductive structure 202 can each include any number of layers in substrate 200. Inner terminals 206 and outer terminals 207 can be provided to be spaced apart from each other in a row or column direction on opposing sides of substrate 200. In some examples, the overall thickness of substrate 200 can range from approximately 5 μm to 200 μm. In some examples, substrate 200 can comprise a laminate substrate.

In some examples, substrate 200 can be a redistribution layer ("RDL") substrate. RDL substrates can comprise one or more conductive redistribution layers and one or more dielectric layers. An RDL substrate can include multiple units of redistribution structure 104 suitable for singulation during creation of electronic device 100. RDL substrates can be formed layer by layer over an electronic component to where the RDL substrate is to be coupled. RDL substrates can be formed layer by layer over a carrier and can be entirely or partially removed after an electronic component is coupled to the RDL substrate. RDL substrates can be manufactured layer by layer as a wafer-level substrate on a round wafer in a wafer-level process, or as a panel-level substrate on a rectangular or square panel carrier in a panel-level process.

RDL substrates can be formed in an additive buildup process and can include one or more dielectric layers alternatingly stacked with one or more conductive layers and define respective conductive redistribution patterns or traces configured to collectively fan-out electrical traces outside the footprint of the electronic component, or to fan-in electrical traces within the footprint of the electronic component. The conductive patterns can be formed using a plating process such as, for example, an electroplating process or an electroless plating process. The conductive patterns can comprise a conductive material such as, for example, copper or other plateable metal. The locations of the conductive patterns can be made using a photo-patterning process such as, for example, a photolithography process and a photoresist material to form a photolithographic mask.

The dielectric layers of the RDL substrate can be patterned with a photo-patterning process and can include a photolithographic mask through where light is exposed to photo-pattern desired features such as vias in the dielectric layers. The dielectric layers can be made from photo-definable organic dielectric materials such as, for example, polyimide (PI), benzocyclobutene (BCB), or polybenzoxazole (PBO). Such dielectric materials can be spun-on or otherwise coated in liquid form, rather than attached as a pre-formed film. To permit proper formation of desired photo-defined features, such photo-definable dielectric materials can omit structural reinforcers or can be filler-free, without strands, weaves, or other particles, and could interfere with the light from the photo-patterning process. In some examples, such filler-free characteristics of filler-free dielectric materials can permit a reduction of the thickness of the resulting dielectric layer. Although the photo-definable dielectric materials described above can be organic materials, in some examples the dielectric materials of the RDL substrates can comprise one or more inorganic dielectric layers. Some examples of inorganic dielectric layers can comprise silicon nitride ($Si_3N_4$), silicon oxide ($SiO_2$), or silicon oxynitride (SiON). The inorganic dielectric layers can be formed by growing the inorganic dielectric layers using an oxidation or nitridization process instead using photo-defined organic dielectric materials. Such inorganic dielectric layers can be filler-free, without strands, weaves, or other dissimilar inorganic particles. In some examples, the RDL substrates can omit a permanent core structure or carrier such as, for example, a dielectric material comprising bismaleimide triazine (BT) or FR4 and these types of RDL substrates can comprise or be referred to as a coreless substrate.

In some examples, substrate 200 can be a pre-formed substrate. Pre-formed substrates can be manufactured prior to attachment to an electronic component (or prior to disposal over carrier 201) and can comprise dielectric layers between respective conductive layers. The conductive layers can comprise copper and can be formed using an electroplating process. The dielectric layers can be relatively thicker non-photo-definable layers that can be attached as a pre-formed film rather than as a liquid and can include a resin with fillers such as strands, weaves, or other inorganic particles for rigidity or structural support. Since the dielectric layers are non-photo-definable, features such as vias or openings can be formed by using a drill or laser. In some examples, the dielectric layers can comprise a prepreg material or Ajinomoto Buildup Film (ABF). The pre-formed substrate can include a permanent core structure or carrier such as, for example, a dielectric material comprising BT or FR4, and dielectric and conductive layers can be formed on the permanent core structure. In other examples, the pre-formed substrate can be a coreless substrate and omits the permanent core structure, and the dielectric and conductive layers can be formed on a sacrificial carrier that is removed after formation of the dielectric and conductive layers and before attachment to the electronic device. The pre-formed substrate can be referred to as a printed circuit board (PCB) or a laminate substrate. Such pre-formed substrate can be formed through a semi-additive or modified-semi-additive process. Substrates in this disclosure can comprise pre-formed substrates or RDL substrates.

FIG. 2B shows a cross section view of electronic device 100 at a later stage of manufacture. In the example shown in FIG. 2B, metallic core balls 106 can be provided over substrate 200. Metallic core balls 106 can be coupled to inner terminals 206 of conductive structure 202. Metallic core balls 106 can be provided with fusible coating 205 surrounding or substantially surrounding the metallic core of metallic core balls 106. Metallic core balls 106 can be made of conductive materials having a higher melting point than the surrounding fusible coating 205 such as, for example, copper, gold, silver, palladium, or nickel. Metallic core balls 106 can be referred to as a solder-coated-metallic-core balls. In some examples, the heights of metallic core balls 106 can range from approximately 3 μm to 200 μm. Metallic core balls 106 can be spaced apart from each other in a row, column, array, or other pattern.

Figures 2C, 2D:
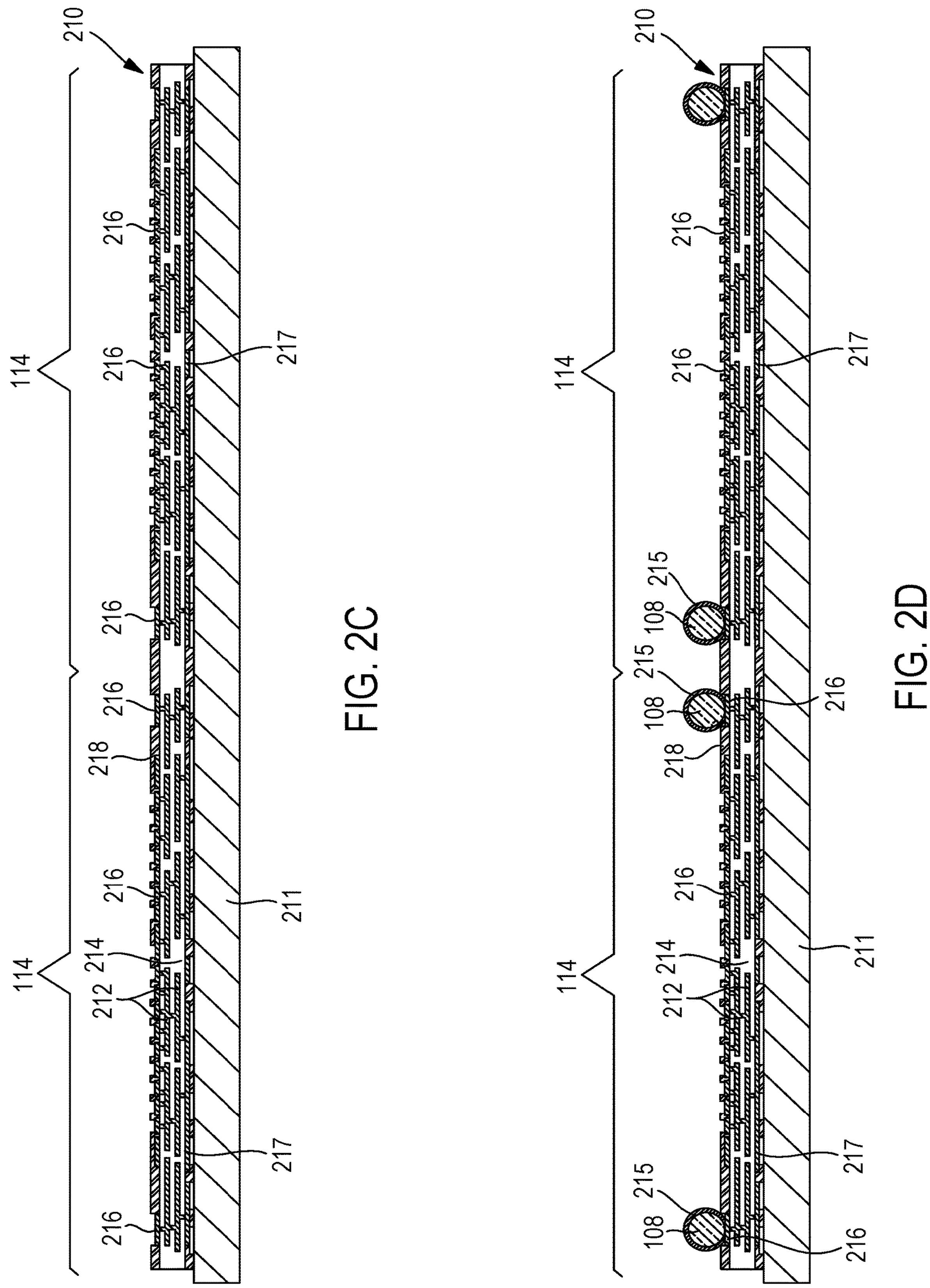

FIG. 2C shows a cross section view of electronic device 100 at a later stage of manufacture. In the example shown in FIG. 2C, substrate 210 can be provided on the surface of carrier 211. In some examples, substrate 210 can comprise multiple redistribution structures 114 formed integrally with one another and arranged in rows, columns, an array, or any other arrangement. Redistribution structure 114 can be used as a lower redistribution structure in subsequent steps described below. Substrate 210 can comprise dielectric structure 214 and conductive structure 212. Conductive structure 212 can comprise inner terminals 216 and outer terminals 217. An inner dielectric layer 218 of dielectric structure 214 can be on an inner side of substrate 210. Inner dielectric layer 218 can be adjacent and partially covering inner terminals 216. Outer terminals 217 of conductive structure 212 can be provided on an outer side of substrate 210, opposite inner terminals 216 (e.g., on a side of substrate 210 that is facing carrier 211). Substrate 210 can comprise structures or processing steps similar to or the same as those described for substrate 200. Conductive structure 212 can comprise structures or processing steps similar to or the same as those described for conductive structure 202. Dielectric structure 214 can comprise structures or processing steps similar to or the same as those described for dielectric structure 204. Inner terminals 216 can comprise structures or processing steps similar to or the same as those described for inner terminals 206. Outer terminals 217 can comprise structures or processing steps similar to or the same as those described for outer terminals 207. Inner dielectric layer 218 can comprise structures or processing step similar to or the same as those described for inner dielectric layer 208.

FIG. 2D shows a cross section view of electronic device 100 at a later stage of manufacture. In the example shown in FIG. 2D, metallic core balls 108 can be provided over substrate 210. Metallic core balls 108 can be coupled to inner terminals 216. Metallic core balls 108 can be provided with fusible coating 215 surrounding or substantially surrounding the metallic core of metallic core balls 106. Metallic core balls 108 can comprise structures or processing steps similar to or the same as those described for metallic core balls 106. Fusible coating 215 can comprise structure or processing steps similar to or the same as those described herein for fusible coating 205.

Figure 2E:
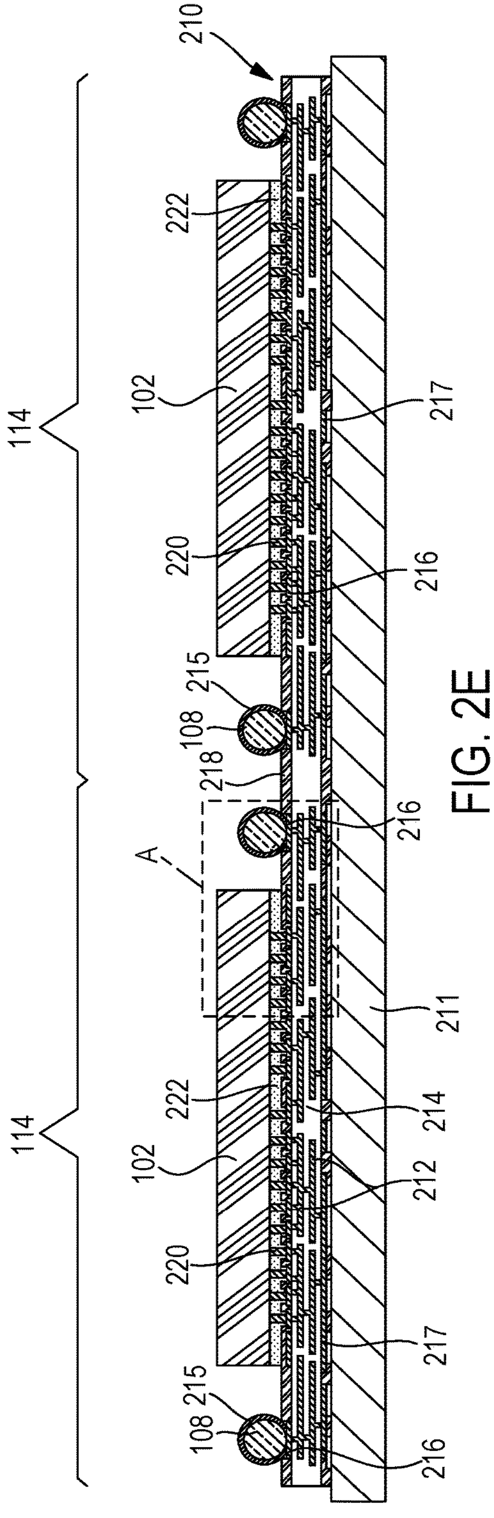
Figure 2E:
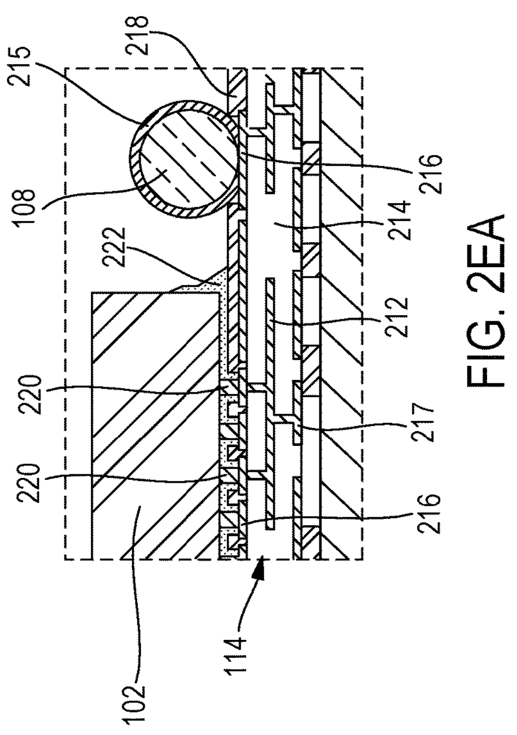

FIGS. 2E and 2EA show cross section views of electronic device 100 at a later stage of manufacture. FIG. 2EA shows section A from FIG. 2E in greater detail. Electronic component 102 can be provided over substrate 210. In the example of FIGS. 2E and 2EA, electronic component 102 can be provided over redistribution structure 114 between metallic core balls 108. Electronic component 102 can be coupled to inner terminals 216 of redistribution structure 114. In some examples, the lower side of electronic component 102 (e.g., the side oriented toward redistribution structure 114) can comprise or be referred to as an active side and the upper side of electronic component 102 (e.g., the side oriented away from redistribution structure 114) can comprise or be referred to as an inactive side or a backside. Electronic component 102 can comprise component interconnects 220 on the lower side. Component interconnects 220 can be provided on the lower side of electronic component 102 and can be spaced apart from each other in a row, column, array, or other pattern. Component interconnects 220 can comprise or be referred to as bumps, pads, or pillars. Component interconnects 220 can be input/output terminals of electronic component 102. In some examples, component interconnects 220 can be provided on the lower side of electronic component 102 through electrolytic plating, electroless plating, sputtering, physical vapor deposition (PVD), chemical vapor deposition (CVD), metal organic chemical vapor deposition (MOCVD), atomic layer deposition (ALD), low pressure chemical vapor deposition (LPCVD), or plasma enhanced chemical vapor deposition (PECVD). For example, after a photoresist pattern exposing the bond pad of electronic component 102 is provided, component interconnects 220 can be provided and coupled to the exposed bond pad. In some examples, the thicknesses (or height) of component interconnects 220 can range from approximately 10 μm to 100 μm, and the pitch can range from approximately 20 μm to 300 μm.

In some examples, pick-and-place equipment can pick up electronic component 102 and place it on redistribution structure 114. Component interconnects 220 of electronic component 102 can be located on the upper sides of inner terminals 216 of redistribution structure 114. Subsequently, component interconnects 220 of electronic component 102 can be bonded to inner terminals 216 through a reflow or thermal compression bonding process. In some examples, electronic component 102 can comprise or be referred to as a die, a chip, or a package.

Figure 2F:
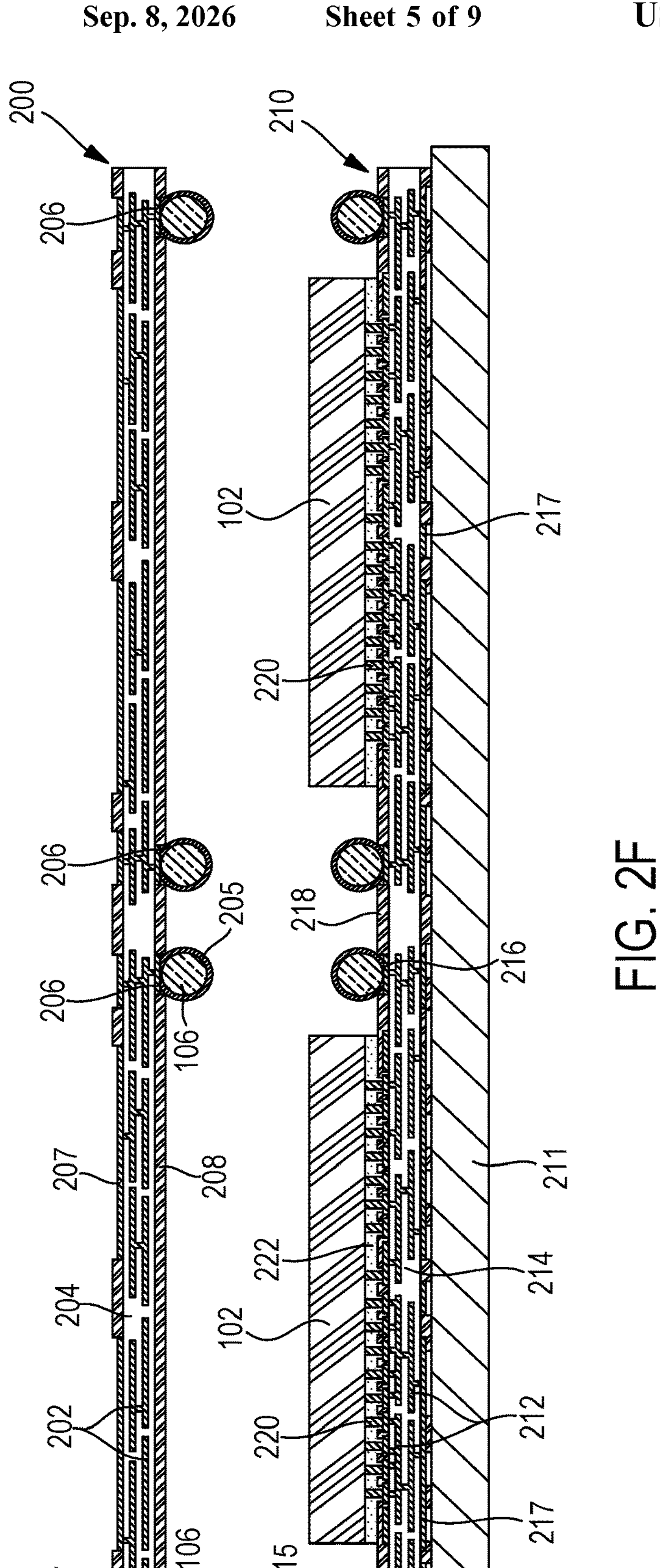

In some examples, an underfill 222 can be positioned between electronic component 102 and redistribution structure 114. Underfill 222 can be coupled to the lower side of electronic component 102 and the inner side of redistribution structure 114. Underfill 222 can be coupled to component interconnects 220 of electronic component 102. Underfill 222 can comprise or be referred to as a dielectric layer or a non-conductive paste. Underfill 222 can be free of inorganic fillers. In some examples, underfill 222 can comprise or be referred to as capillary underfill (CUF), non-conductive paste (NCP), non-conductive film (NCF), anisotropic conductive film (ACF), or anisotropic conductive paste (ACP). In some examples, underfill 222 can be molded underfill (MUF), and underfill 222 can be considered part of encapsulant 122 (FIG. 2F). In some examples, underfill 222 can be cured after being positioned between electronic component 102 and redistribution structure 114. In some examples, after underfill 222 is provided to cover the inner side of redistribution structure 114, component interconnects 220 of electronic component 102 can pass through underfill 222 and be coupled to inner terminals 216. Underfill 222 can prevent or reduce occurrences of electronic component 102 separating from redistribution structure 114 due to physical impact or chemical processes.

FIG. 2F shows a cross section view of electronic device 100 at a later stage of manufacture. In the example shown in FIG. 2F, substrate 200 can be released from carrier 201 and positioned over substrate 210. Individual units of upper redistribution structure 104 can be aligned vertically with individual units of lower redistribution structure 114. Upper metallic core balls 106 can be aligned vertically with lower metallic core balls 108. In some examples, alignment can be performed on thermocompression equipment used to couple metallic core balls 106 and metallic core balls 108 in subsequent processing steps.

Figure 2G:
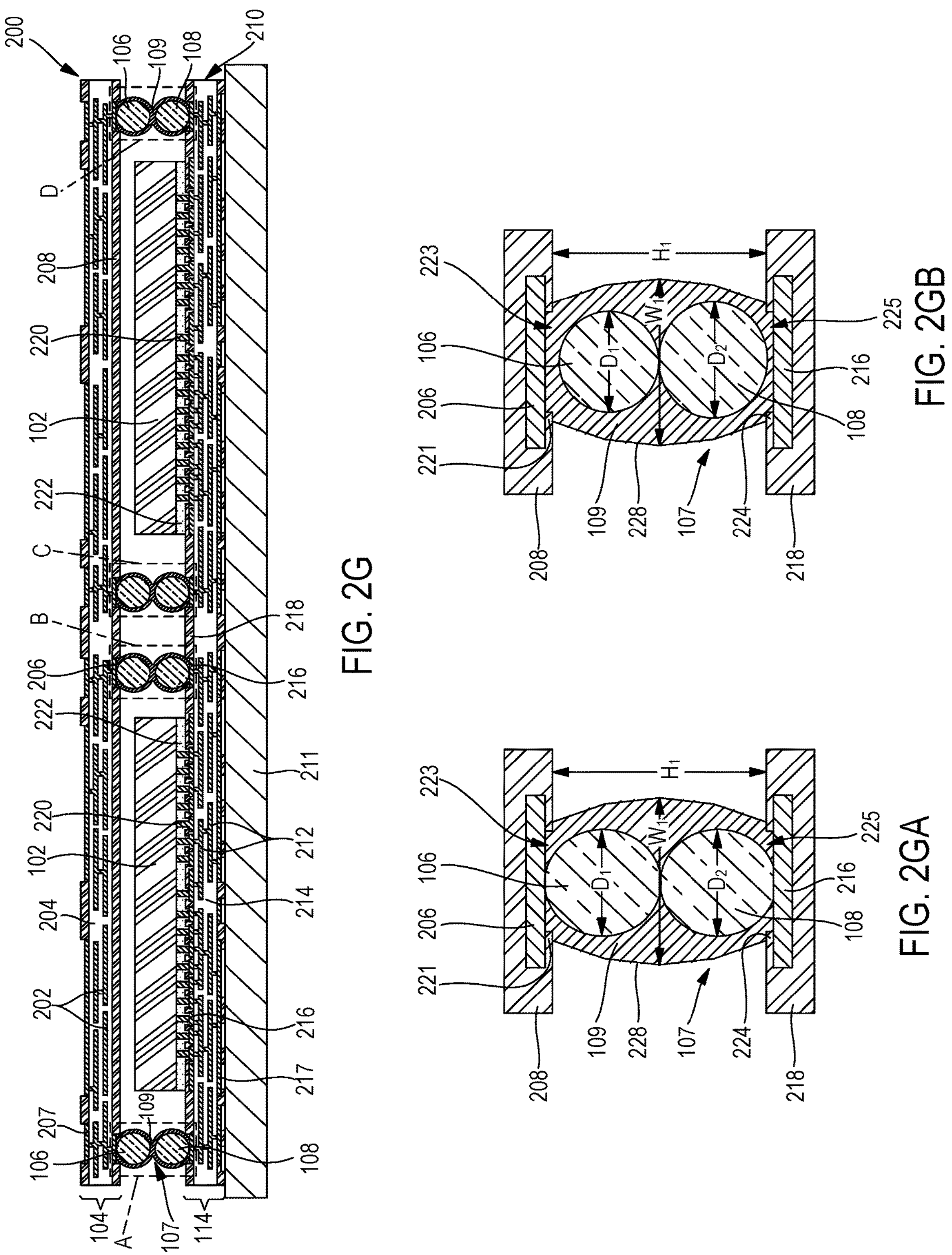
Figure 2G:
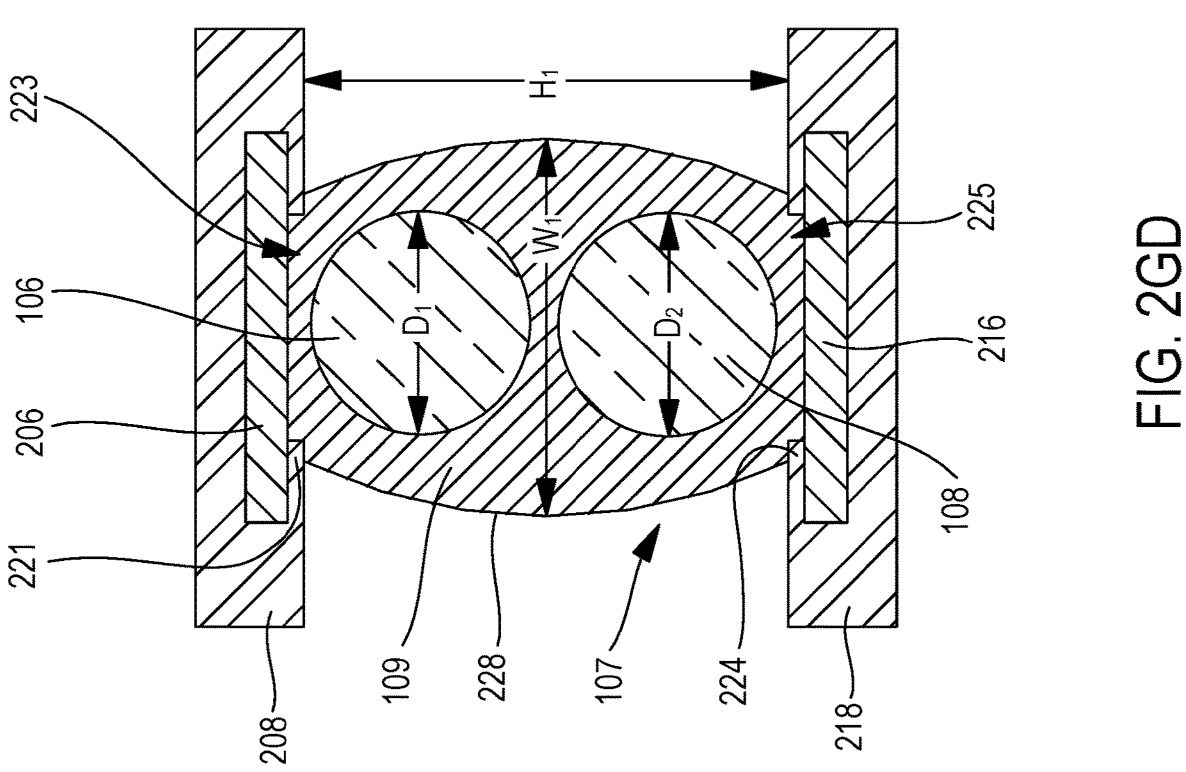
Figure 2G:
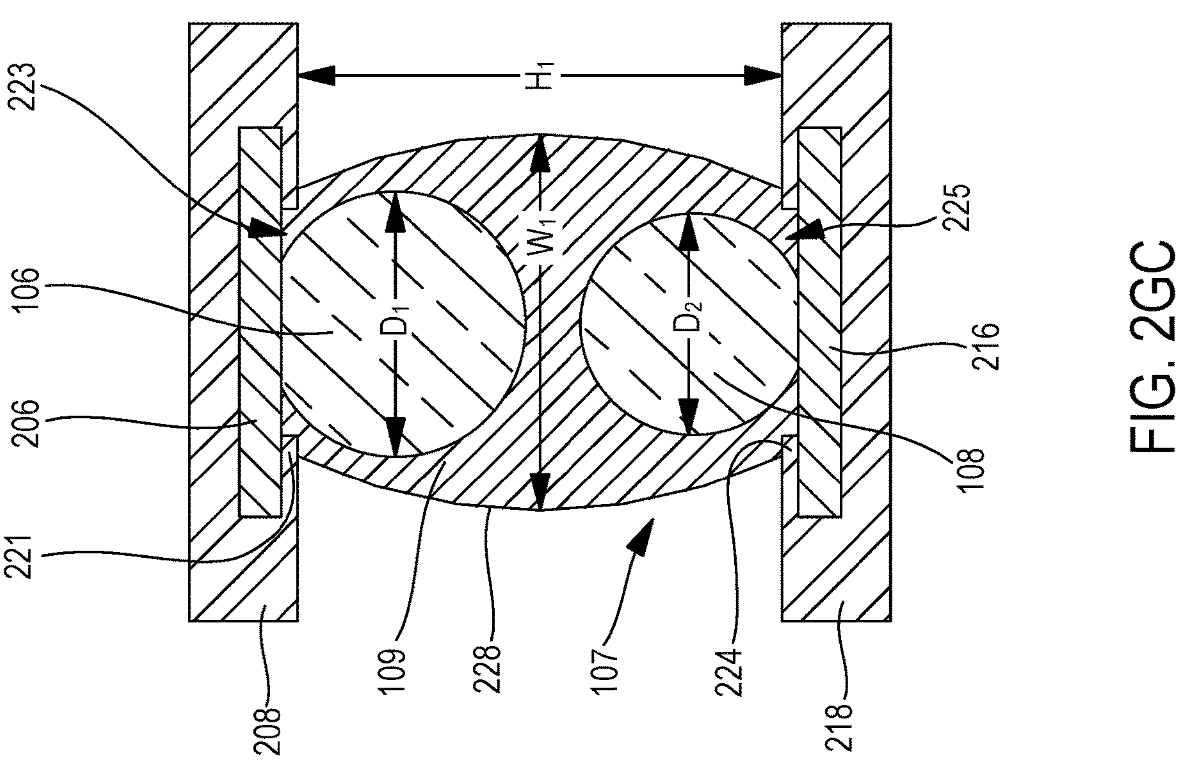

FIG. 2G shows a cross section view of electronic device 100 at a later stage of manufacture. In the example of FIG. 2G, metallic core balls 106 are coupled to metallic core balls 108. In some examples, thermocompression can be used to couple the metallic core balls. The temperature and pressure applied during thermocompression can be selected to maintain alignment while flowing fusible coatings 205, 215 (FIG. 2F) into fusible material 109 to couple upper metallic core balls 106 to the vertically aligned lower metallic core balls 108. In some examples, metallic core balls 106, 108 can be spherical. In some examples, one or more metallic core balls can be oblong or flattened against an adjacent inner terminal or metallic core ball to resist lateral displacement.

In some examples, thermocompression bonding can couple metallic core ball 106 and metallic core ball 108 together with fusible material 109. The temperature can be maintained above a temperature threshold for a predetermined duration. Examples of suitable temperature thresholds can include approximately 200° C., approximately 210° C., approximately 220° C., approximately 240° C., or approximately 250° C. As used herein in reference to temperatures, approximately can mean+/−5° C., +/−10° C., +/−15° C., +/−20° C., or +/−25° C. Examples of suitable durations can include periods greater than approximately 10 seconds (sec), approximately 15 sec, approximately 20 sec, or approximately 25 sec. As used herein in reference to periods, approximately can mean+/−1 sec+/−2 sec, +/−3 sec, +/−4 sec, or +/−5 sec. In one example, the temperature can be maintained above a threshold of approximately 255° C. for a period greater than approximately 15 seconds. In some examples, a maximum temperature applied during thermocompression bonding of metallic core ball 106 and metallic core ball 108 can be approximately 235° C., approximately 245° C., approximately 255° C., approximately 265° C., or approximately 275° C.

In some examples, a temperature can be applied concurrently with a pressure to bond fusible coating 205 (FIG. 2F) and fusible coating 215 (FIG. 2F), thereby providing fusible material 109 extending between inner terminal 206 and inner terminal 216. The pressure can be applied in a compressive direction (e.g., compressing substrate 200 towards substrate 210) while maintaining alignment of metallic core balls 106 with metallic core balls 108. In some examples, a pressure of approximately 300 Newtons (N), approximately 320 N, approximately 360 N, or approximately 380 N can be applied. As used herein with reference to force or pressure, approximately can mean+/−5%, +/−10%, +/−15%, +/−20%, or +/−25%. In some examples, the pressure applied during bonding can be determined based on the number of vertical interconnects 107 to be formed by fusing aligned metallic core balls on substrate 200 and substrate 210.

FIG. 2GA shows area A from FIG. 2G in greater detail after coupling metallic core balls 106 to metallic core balls 108. In the example of FIG. 2GA, fusible coating 205 (FIG. 2F) around upper metallic core ball 106 and fusible coating 215 (FIG. 2F) around lower metallic core balls 108 can be reflowed to form vertical interconnect 107 including upper metallic core ball 106, lower metallic core ball 108, and fusible material 109. Vertical interconnect 107 can comprise upper metallic core ball 106 having diameter $D_1$, lower metallic core ball 108 having diameter $D_2$, and fusible material 109 having a width $W_1$.

In the depicted example of FIG. 2GA, diameter $D_1$ and diameter $D_2$ are equal. In other examples, diameter $D_1$ can be greater than diameter $D_2$, or diameter $D_1$ can be less than diameter $D_2$. Selecting metallic core balls 106 and 108 with diameter $D_1$ less than (or greater than) diameter $D_2$ can tend to increase room for sliding or misalignment. Selecting metallic core balls having smaller diameters $D_1$ and $D_2$ tends to reduce the height of, and volume of, fusible material 109 in vertical interconnect 107. Selecting metallic core balls having larger diameters $D_1$ and $D_2$ tends to increase the height of, and the volume of, fusible material 109 in vertical interconnect 107. Reduced volume of fusible material 109 can reduce the width or footprint of vertical interconnect 107 in some examples.

In some examples, vertical interconnect 107 can have sidewall 228. Sidewall 228 can be shaped under surface tension as fusible coating 205 and fusible coating 215 are reflowed into fusible material 109. Fusible material 109 can have an oblong geometry or a substantially convex geometry. Fusible material 109 of vertical interconnect 107 can be coupled to inner terminal 206 and inner terminal 216.

In some examples, fusible material 109 can have a maximum width $W_1$ in a region encircling a point between the center of metallic core ball 106 and the center of metallic core ball 108. In some examples, a maximum width $W_1$ of fusible material 109 can occur at a height from redistribution structure 114 of approximately $D_2$, or at a height from redistribution structure 114 of approximately one half of height $H_1$. A maximum width $W_1$ tends to be greater than diameter $D_1$ and greater than diameter $D_2$. Fusible material 109 can have a maximum width $W_1$ in a region encircling the contact point of metallic core ball 106 and metallic core ball 108. Sidewall 228 can have a substantially convex geometry at a region disposed around or encircling the contact point between metallic core ball 106 and metallic core ball 108.

In some example, metallic core ball 106 can be separated from metallic core ball 108 by fusible material, and width $W_1$ can occur at a region disposed around or encircling the gap between metallic core ball 106 and metallic core ball 108.

In some examples, upper metallic core ball 106 can be in contact with lower metallic core ball 108 in vertical interconnect 107. In some examples, upper metallic core ball 106 can be separated from lower metallic core ball 108 by fusible material 109 after bonding. In some examples, metallic core balls 106, 108 can be separated from inner terminals 206, 216 by fusible material 109 after bonding. In some examples, metallic core balls 106, 108 can be in contact with inner terminals 206, 216 after bonding.

In some examples, a portion 221 of inner dielectric layer 208 covers a portion of inner terminal 206. Portion 221 of inner dielectric layer 208 can overhang a portion of inner terminal 206. A portion of metallic core ball 106 can extend into opening 223 and can be above lower side of portion 221 of inner dielectric layer 208. Inner terminal 206 can be recessed relative to inner dielectric layer 208. Fusible material 109 can completely or partially fill opening 223 defined by inner dielectric layer 208 over inner terminal 206. Although inner terminal 206 is recessed in the example of FIG. 2GA, inner terminal 206 can be coplanar with inner dielectric layer 208 in other examples.

In some examples, a portion 224 of inner dielectric layer 218 covers a portion of inner terminal 216. Portion 224 of inner dielectric layer 218 can overhang a portion of inner terminal 216. A portion of metallic core ball 108 can extend into opening 225 and can be below an upper side of portion 224 of inner dielectric layer 218. Inner terminal 216 can be recessed relative to inner dielectric layer 218. Fusible material 109 can completely or partially fill opening 225. Fusible material 109 can cover portion 224 of inner dielectric layer 218 above inner terminal 216. Although inner terminal 216 is recessed in the example of FIG. 2GA, inner terminal 216 can be coplanar with inner dielectric layer 218 in other examples.

In some examples, height $H_1$ can be the height of vertical interconnect 107 between the inner surface of substrate 200 and the inner surface of substrate 210. In examples including gaps between metallic core balls 106 and 108 or between metallic core balls 106, 108 and inner terminals 206, 216, height $H_1$ can be greater than the sum of diameter $D_1$ and diameter $D_2$. Increased height $H_1$ tends to enable electronic device 100 to house a thicker electronic component 102 between redistribution structure 104 and redistribution structure 114. Height $H_1$ of vertical interconnect 107 can be controlled by selecting metallic core balls 106, 108 having desired diameters $D_1$ and $D_2$. In some examples, inner terminal 206 contacts metallic core ball 106, metallic core ball 106 contacts metallic core ball 108, and metallic core ball 108 contacts inner terminal 216.

In examples with metallic core ball 106 and metallic core ball 108 stacked directly on center in the direction of height $H_1$, and with metallic core ball 106 and metallic core ball 108 contacting one another and contacting adjacent inner terminals 206, 216, height $H_1$ can be approximately the sum of diameter $D_1$ and diameter $D_2$ less the depth of opening 223 and the depth of opening 225 exposing the inner terminals 206, 216. In examples with metallic core ball 106 and metallic core ball 108 stacked off center, and with metallic core ball 106 and metallic core ball 108 contacting one another and contacting adjacent inner terminals 206, 216, height $H_1$ can be less than the sum of diameter $D_1$ and diameter $D_2$. Lateral offset of metallic core ball 106 relative to metallic core ball 108 can reduce height $H_1$ by an amount based on the amount of lateral offset. In some examples, metallic core ball 106 and metallic core ball 108 of vertical interconnect 107 tend to maintain a minimum height $H_1$ based on the fixed diameters $D_1$ and $D_2$.

In one example, metallic core balls 106 having diameter $D_1$ equal to 180 μm and metallic core balls 108 diameter $D_2$ equal to 180 μm can accommodate a die thickness of 280 μm. The term die thickness refers to the measurement of electronic component 102 (FIG. 2G) in the direction of height $H_1$. Increasing die thickness of electronic component 102 tends to improve thermal performance of electronic device 100. In some examples, electronic component 102 can have a height from redistribution structure 114 that is greater than the diameter $D_2$ of metallic core ball 108. In some examples, electronic component 102 can have a height from redistribution structure 114 that is less than the sum of diameter $D_1$ and diameter $D_2$.

In the example of FIG. 2GA, metallic core ball 106 can be in direct contact with inner terminal 206 and metallic core ball 108. Metallic core ball 108 can directly in contact with inner terminal 206. Diameter $D_1$ can be equal to Diameter $D_2$.

FIG. 2GB shows area B from FIG. 2G in greater detail after coupling metallic core balls 106 to metallic core balls 108. The features in the example of FIG. 2GB can be similar to or the same as features in the example of FIG. 2GA. In the example of FIG. 2GB, upper metallic core ball 106 can directly contact lower metallic core ball 108. Upper metallic core ball 106 can be separated from inner terminal 206. Fusible material 109 can be located between upper metallic core ball 106 and inner terminal 206. Fusible material 109 can couple upper metallic core ball 106 and inner terminal 206. Lower metallic core ball 108 can be separated from inner terminal 216. Fusible material 109 can be located between lower metallic core ball 108 and inner terminal 216. Fusible material 109 can couple lower metallic core ball 108 and inner terminal 216. Diameter $D_1$ of upper metallic core ball 106 can be less than diameter $D_2$ of lower metallic core ball 108.

In the example of FIG. 2GC, which depicts area C from FIG. 2G in greater detail after coupling metallic core balls 106 to metallic core balls 108. Upper metallic core ball 106 can be separated by a gap from lower metallic core ball 108, with fusible material 109 filling the gap between upper metallic core ball 106 and lower metallic core ball 108. Upper metallic core ball 106 can directly contact inner terminal 206. Lower metallic core ball 108 can directly contact inner terminal 216. Diameter $D_1$ of upper metallic core ball 106 can be greater than diameter $D_2$ of lower metallic core ball 108. Other features in the example of FIG. 2GC can be similar to or the same as the examples of FIGS. 2GA and 2GB.

FIG. 2GD shows area D from FIG. 2G in greater detail after coupling metallic core balls 106 to metallic core balls 108. Features in the example of FIG. 2GD can be similar to or the same as the examples of FIGS. 2GA through 2GC. In the example of FIG. 2GD, upper metallic core ball 106 can be separated by a gap from inner terminal 206, lower metallic core ball 108 can be separated by a gap from inner terminal 216, and upper metallic core ball 106 can be separated by a gap from lower metallic core ball 108. The gaps between inner terminal 206, upper metallic core ball 106, lower metallic core ball 108, and inner terminal 216 can be filled with fusible material 109. Diameter $D_1$ of upper metallic core ball 106 can be equal to diameter $D_2$ of lower metallic core ball 108.

While FIGS. 2GA through 2GD depict various examples of spacing configurations and diameters $D_1$ and $D_2$. It is contemplated and understood that vertical interconnects 107 in the same electronic device can all have a same or similar configurations. It is further contemplated and understood that vertical interconnects 107 in the same electronic device can have configurations comprising any combination of the features depicted in FIGS. 2GA, 2GB, 2GC, 2GD, or generally described herein.

Figures 2H, 2I:
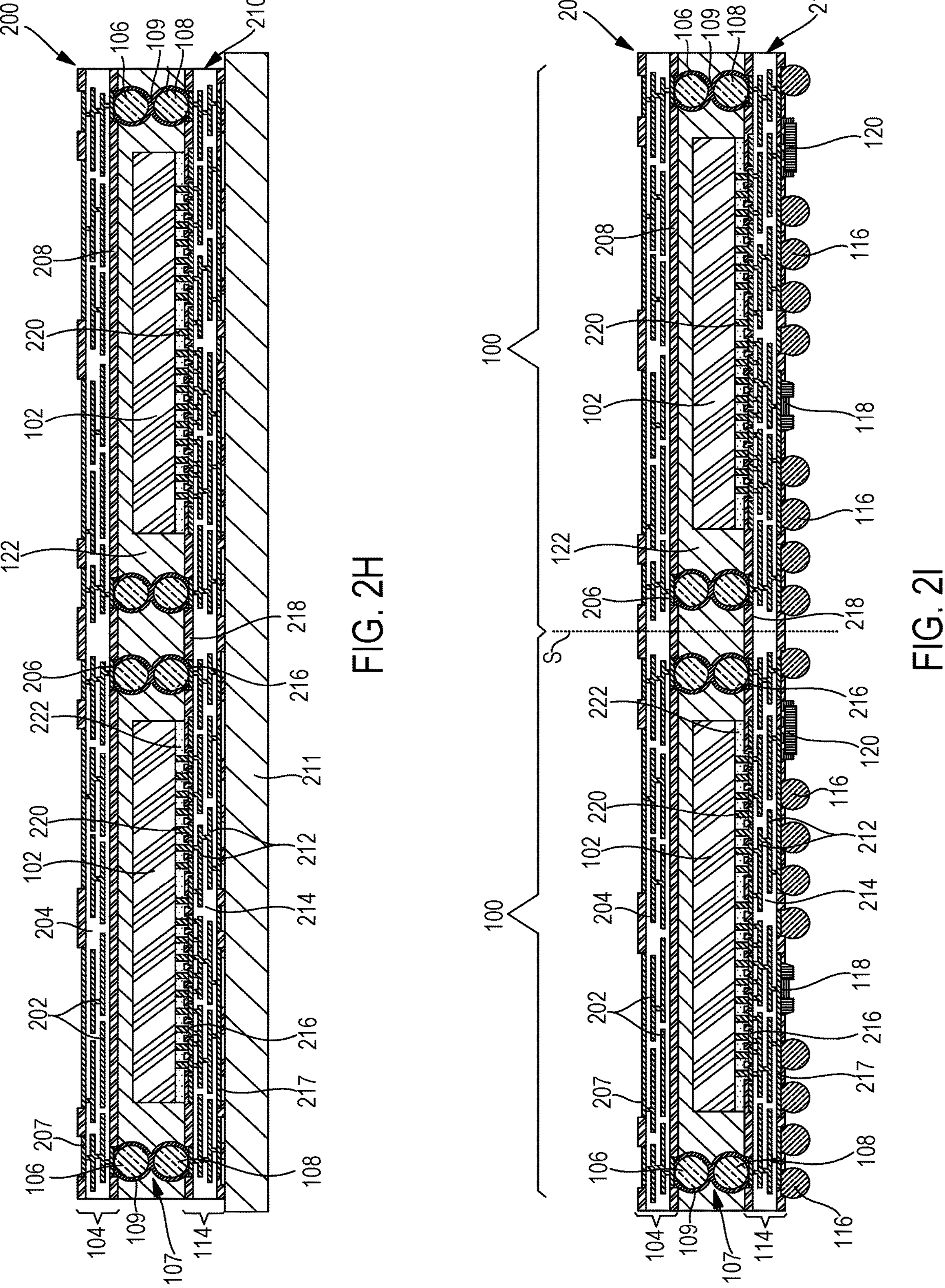

FIG. 2H shows a cross section view of electronic device 100 at a later stage of manufacture. In the example of FIG. 2H, encapsulant 122 can be provided to cover the inner side of substrate 200, the inner side of substrate 210, electronic component 102, and vertical interconnects 107.

In some examples, encapsulant 122 can comprise or be referred to as a body, a package body, or a molding. For example, encapsulant 122 can comprise an epoxy mold compound, a resin, a filler-reinforced polymer, a B-stage pressed film or gel. Encapsulant 122 can be formed by compression molding, transfer molding, liquid body molding, vacuum lamination, paste printing, or film assist molding.

FIG. 2I shows a cross section view of electronic device 100 at a later stage of manufacture. In the example of FIG. 2I, lower redistribution structure 114 can be released from carrier 211 to expose an outer side of redistribution structure 114 (e.g., a side oriented away from electronic component 102) for further processing. External interconnects 116 can be provided on the outer side of redistribution structure 114. Before external interconnects 116 are provided on redistribution structure 114, carrier 211 can be separated from redistribution structure 114. In some examples, after the adhesion of temporary bond layer interposed between carrier 211 and redistribution structure 114 is removed or reduced by applying heat, light, a chemical solution, or a physical external force, carrier 211 can be separated from the outer side of redistribution structure 114. The temporary bond layer of carrier 211 can be separated from redistribution structure 114 while remaining attached to carrier 211. Carrier 211 can be removed to expose the outer side of redistribution structure 114.

In some examples, external interconnects 116 can be coupled to outer terminals 217 of redistribution structure 114. In some examples, external interconnects 116 can comprise tin (NS), silver (Ag), lead (Pb), copper (Cu), Sn—Pb, Sn37-Pb, Sn95-Pb, Sn—Pb—Ag, Sn—Cu, Sn—Ag, Sn—Au, Sn—Bi, or Sn—Ag—Cu. For example, external interconnects 116 can be formed through a reflow process after forming a conductive material including solder on outer terminals 217 through a ball-drop process. External interconnects 116 can comprise or be referred to as conductive balls such as solder balls, conductive pillars such as copper pillars, or conductive posts having solder caps formed on copper pillars. In some examples, external interconnects 116 can be ball-grid arrayed or land-grid-arrayed outside redistribution structure 114. In some examples, the sizes of external interconnects 116 can range from approximately 25 μm to 500 μm. In some examples, external interconnects 116 can be referred to as external input/output terminals of electronic device 100.

In some examples, external interconnects 116 can be electrically connected to electronic component 102 through redistribution structure 114, vertical interconnects 107, or redistribution structure 104. In some examples, additional electronic components 118, 120, for example, die, chips, passive components, (e.g., LSC, DTC), etc., can be coupled to redistribution structure 114. For example, the additional electronic components 118, 120 can be coupled to outer terminals 217. Electronic component 102 and external interconnects 116 can be electrically coupled to electronic components 118, 120 via redistribution structure 114. Electronic component 102, external interconnects 116, or electronic components 118, 120 can be coupled to redistribution structure 104 via redistribution structure 114 and vertical interconnects 107. In some examples, additional electronic components (e.g., die, chips, passive components, packages, etc.) can be coupled to outer terminals 207 or inner terminals 206 of redistribution structure 114.

In some examples, singulation along saw street S can be performed to separate redistribution structures 104, 114 and encapsulant 122 into individual electronic devices 100. Electronic device 100 can comprise redistribution structures 104, 114, electronic component 102, underfill 222, metallic core balls 106 and 108, encapsulant 122, and external interconnects 116. In some examples, electronic device 100 can comprise also comprise electronic components 118, 120.

Figure 3:
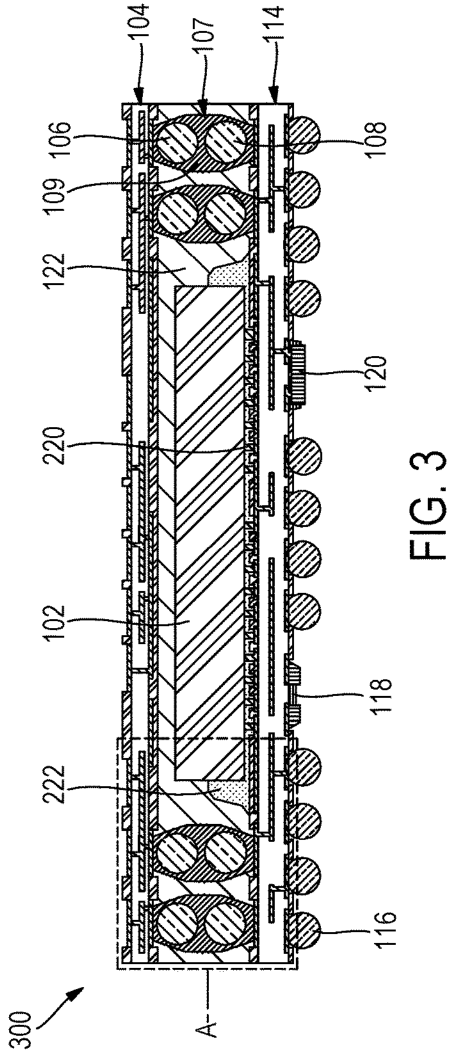
FIGS. 3 and 3A illustrate a cross-sectional view of an example electronic device.
Figure 3A:
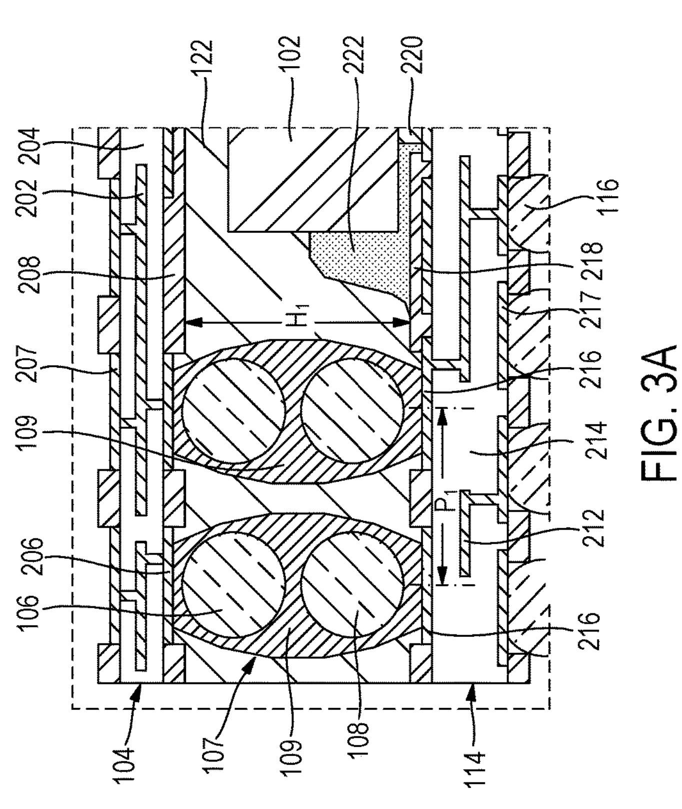

Referring now to FIGS. 3 and 3A, an example electronic device 300 is shown. FIG. 3A shows region A of electronic device 300 of FIG. 3 in greater detail. In the example of FIG. 3, electronic device 300 can have similar structures and processing steps to those described above for electronic device 100. Electronic device 300 can include multiple vertical interconnects 107 adjacent one or more lateral side(s) of electronic component 102. Each vertical interconnect 107 can comprise metallic core ball 106, metallic core ball 108, and fusible material 109. Underfill 222 can fill a volume between electronic component 102 and redistribution structure 114. Encapsulant 122 can fill a volume between redistribution structure 114 and redistribution structure 104. In the example of FIG. 3A, metallic core ball 106 and metallic core ball 108 are depicted as spaced or gapped apart from one another and from inner terminals 206 and 216. In other examples, metallic core ball 108 and metallic core ball 106 can be in direct contact with one another or with inner terminals 206 or 216.

In some examples, Pitch $P_1$ between adjacent inner terminals coupled to adjacent vertical interconnects 107 can be approximately 0.20 mm, approximately 0.21 mm, approximately 0.22 mm, approximately 0.23 mm, approximately 0.24 mm, approximately 0.25 mm, approximately 0.26 mm, approximately 0.27 mm, approximately 0.28 mm, or approximately 0.29 mm. Pitch $P_1$ of vertical interconnect 107 comprising metallic core ball 106 and metallic core ball 108 tends to be similar to a vertical interconnect comprising a single metallic core ball. Pitch $P_1$ can thus be maintained while height $H_1$ is increased to accommodate greater die thicknesses relative to single-metallic-core-ball interconnects. Pitch $P_1$ can be less than height $H_1$ in various examples. In an example where diameters $D_1$ and $D_2$ are both 180 μm, $H_1$ can be approximately 360 μm and pitch $P_1$ can be approximately 270 μm.

Various example devices and methods can include vertical interconnects having multiple metallic core balls. The height of vertical interconnects with multiple metallic core balls can be increased relative to the height of vertical interconnects having a single metallic core ball while maintaining a similar footprint. Vertical interconnects with stacked metallic core balls thus tend to increase available vertical space to accommodate thicker electronic components and maintain a same or similar interconnect pitch relative to vertical interconnects with single metallic core balls. By enabling the use of thicker electronic components, vertical interconnects described above tend to improve thermal performance in electronic devices. In some examples, methods of manufacturing can be simplified as vertical interconnects with multiple metallic core balls tend to reduce the use of artificial stretching steps sometimes used for vertical interconnects with single metallic core balls. Vertical interconnects with multiple metallic core balls also enable control of solder volume and interconnect height by selecting the diameters of upper and lower metallic core balls. Joint strength can be improved by selecting metallic core balls coated with the desired volume of fusible material.

The present disclosure includes reference to certain examples; however, it will be understood by those skilled in the art that various changes may be made and equivalents may be substituted without departing from the scope of the disclosure. In addition, modifications may be made to the disclosed examples without departing from the scope of the present disclosure. Therefore, it is intended that the present disclosure not be limited to the examples disclosed, but that the disclosure will include all examples falling within the scope of the appended claims.

What is claimed is:

1. An electronic device, comprising:

a first substrate;

an electronic component disposed over a side of the first substrate;

a vertical interconnect coupled to the side of the first substrate adjacent the electronic component, the vertical interconnect comprising:

a first metallic core ball proximate the first substrate;

a second metallic core ball disposed above the first metallic core ball and distal from the first substrate; and a fusible material coupling the first metallic core ball with the second metallic core ball, wherein the fusible material is coupled to the first substrate; and a second substrate disposed over the electronic component and the vertical interconnect, wherein the fusible material of the vertical interconnect is coupled to the second substrate with the electronic component spaced apart from the second substrate.

2. The electronic device of claim 1, wherein a diameter of the first metallic core ball is greater than a diameter of the second metallic core ball.

3. The electronic device of claim 1, wherein a sidewall of the vertical interconnect comprises a substantially convex geometry in a region encircling a point between the first metallic core ball and the second metallic core ball.

4. The electronic device of claim 1, wherein a height of the electronic component measured from the side of the first substrate is greater than a diameter of the first metallic core ball.

5. The electronic device of claim 1, wherein the first substrate comprises:

an inner terminal; and a dielectric structure that defines an opening over the inner terminal, wherein the fusible material extends through the opening to the inner terminal.

6. The electronic device of claim 5, wherein the fusible material extends from the opening onto a portion of the dielectric structure adjacent the opening.

7. The electronic device of claim 1, wherein the first metallic core ball contacts the second metallic core ball.

8. The electronic device of claim 1, further comprising a second vertical interconnect coupled to the first substrate and disposed lateral to the electronic component, wherein the second vertical interconnect comprises a third metallic core ball proximate the first substrate and a fourth metallic core ball distal from the first substrate.

9. An electronic device comprising:

a first substrate comprising first inner terminals;

a fusible material coupled to the first inner terminals;

an electronic component coupled to the first inner terminals;

a first metallic core ball proximate the first substrate and coupled to the fusible material;

a second metallic core ball distal from the first substrate and coupled to the fusible material; and a second substrate comprising a second inner terminal coupled to the fusible material, the second substrate proximate the second metallic core ball and spaced apart from the electronic component.

10. The electronic device of claim 9, wherein a sidewall of the fusible material comprises a substantially convex geometry in a region encircling a point between the first metallic core ball and the second metallic core ball.

11. The electronic device of claim 9, further comprising an electronic component adjacent the first metallic core ball, wherein a height of the electronic component is greater than a height of the first metallic core ball.

12. The electronic device of claim 9, further comprising a dielectric structure that defines an opening over the first inner terminal, wherein the fusible material extends through the opening to the first inner terminal.

13. The electronic device of claim 12, wherein the fusible material extends from the opening onto a portion of the dielectric structure adjacent the opening.

14. The electronic device of claim 9, wherein the first metallic core ball contacts the second metallic core ball.

15. A method of making an electronic device, comprising:

providing a first substrate;

providing a first metallic core ball on the first substrate;

providing a second substrate;

providing a second metallic core ball on a side of the second substrate;

providing an electronic component coupled to the side of the second substrate;

aligning the first metallic core ball and first substrate over the second metallic core ball and second substrate; and coupling the first metallic core ball to the second metallic core ball with a fusible material, wherein the electronic component is spaced apart from the second substrate.

16. The method of claim 15, wherein the fusible material comprises a substantially convex geometry in a region encircling a point between the first metallic core ball and the second metallic core ball.

17. The method of claim 15, wherein a diameter of the first metallic core ball is greater than a diameter of the second metallic core ball.

18. The method of claim 15, further comprising providing an encapsulant between the first substrate and the second substrate, around the first metallic core ball and second metallic core ball, and between the electronic component and the first substrate.

19. The method of claim 15, wherein coupling the first metallic core ball to the second metallic core ball further comprises applying a temperature greater than approximately 220° C. for a period greater than approximately 15 seconds.

20. The method of claim 15, wherein coupling the first metallic core ball to the second metallic core ball further comprises applying a temperature of approximately 255° C.

* * * * *